United States Patent [19]

Hozumi et al.

[11] Patent Number: 5,121,194
[45] Date of Patent: Jun. 9, 1992

[54] SUBSTRATE OUTPUT FOR A SEMICONDUCTOR DEVICE AND A METHOD OF FABRICATING THE SAME

[75] Inventors: Hiroki Hozumi; Kichio Aida, both of Kanagawa, Japan

[73] Assignee: Sony Corporation, Tokyo, Japan

[21] Appl. No.: 633,982

[22] Filed: Dec. 26, 1990

[51] Int. Cl.⁵ .......................................... H01L 27/04
[52] U.S. Cl. ..................................... 357/48; 357/52; 437/38
[58] Field of Search ....................... 357/48, 50, 52, 65, 357/41, 47; 437/20, 28, 38

[56] References Cited

U.S. PATENT DOCUMENTS

| | | | |
|---|---|---|---|
| 4,663,825 | 5/1987 | Maeda | 357/65 |
| 4,893,164 | 1/1990 | Shirato | 357/48 |
| 5,019,888 | 5/1991 | Scott et al. | 357/41 |

*Primary Examiner*—Rolf Hille
*Assistant Examiner*—Roy Potter
*Attorney, Agent, or Firm*—Hill, Van Santen, Steadman & Simpson

[57] ABSTRACT

In a semiconductor device, a first diffusion region on a surface of an output region for a substrate electric potential, and an element segregation third diffusion region under a field insulating layer, are electrically connected together through a second diffusion region. Thus, the substrate electric potential can be easily output at the surface of the output region, even if the first diffusion region on the surface of the output region is formed shallow by a fabrication process at low temperature due to fine designing of the semiconductor device. A patterning process of the output region in the form of a protruded shape is also required, but the process is completed through a procedure using only one ion implantation and one low temperature thermal oxidation, thereby dramatically simplifying the fabrication process.

5 Claims, 4 Drawing Sheets

SUBSTRATE OUTPUT FOR A SEMICONDUCTOR DEVICE AND A METHOD OF FABRICATING THE SAME

BACKGROUND OF THE INVENTION

1. Field of the Invention

The present invention relates to an output structure for a substrate electric potential in a semiconductor device in which an output region for the substrate electric potential is enclosed with a field insulating layer formed by LOCOS (selective oxidation), and a method of producing the output structure of the substrate electric potential.

2. Prior Art

As shown in FIG. 3, the structure of a conventional semiconductor device, in particular of an output region of the substrate electric potential, comprises, for example an element segregation region 23 selectively formed in an N-type epitaxial layer 22 formed on a P-type silicon substrate 21, a field insulating layer 24 selectively formed with LOCOS at a portion corresponding to the element segregation region 23 on the epitaxial layer 22, and a P-type impurity diffusion region 26 (exhibited in dotted line) formed on a surface of an output region 25 enclosed by the field insulating layer and passing through the epitaxial layer 22.

In order to reduce a diffusion amount in a cross direction, to improve the precision in the pattern consistency concerning photolithography technique or the like, and to optimize an epitaxial layer (for example, optimization of concentration and thickness) in relation to the fine designing of semiconductor device, variable processes regarding semiconductor devices and particularly thermal treatment for diffusion of impurities has recently been carried out at low temperature. Such treatment at low temperature simultaneously means the reduction in the diffusion depth xj of the impurities.

However, since the diffusion region 26 in the output region for the substrate electric potential shown in FIG. 3 requires diffusion into a deeper depth down to dashed line 26-1, a diffusion depth $xj_1$ cannot be obtained even through the reduction in the thickness of the epitaxial layer 22. A diffusion depth of the diffusion region formed on a surface of said output region 25 results in a depth $xj_2$, shown by reference numeral 26-2. Accordingly, the epitaxial layer 22 cannot be passed through, as is exhibited in solid lines, causing inconvenience such as difficulty in the output of the substrate electric potential.

As shown in FIG. 4, there is thus provided a method comprising forming in preliminary fashion a diffusion region (pseudo embedding region) 27 of a P-type identical to a type of an element segregation region 23 under an output region 25 for the substrate electric potential at the time of forming the element segregation region 23, and constituting a diffusion region 26 and the above-mentioned diffusion region 27 so that they might join together when the diffusion region 26 is formed on the surface of the contact region 25 of the substrate electric potential in the following process. However, the above-mentioned method involves the inconvenience of a complex fabrication process as in conventional cases. That is, the method requires ion implantation and thermal treatment at high temperature for forming the element segregation region 23 and the diffusion region 27, and it also requires ion implantation and thermal treatment at low temperature for forming the diffusion region 26, involving the inconvenience of a complex process and a high fabrication cost.

SUMMARY OF THE INVENTION

It is accordingly an objective of the present invention to provide a semiconductor device where the output of a substrate electric potential can be easily carried out on the surface of an output region of the substrate electric potential, even under the tendency of a reduction in impurity-diffusion depth due to the fine designing of a semiconductor device.

It is another object of the present invention to simplify the fabrication process of the semiconductor device.

According to one aspect of the present invention there is provided a semiconductor device comprising: a first conduction type element segregation third diffusion region under a field insulating layer, a surface of an output region of a substrate electric potential surrounded with a first conduction type first diffusion region, and said element segregation third diffusion region being in electrical contact with said surface of said output region for the substrate electric potential at the end portion of said field insulating layer through a first conduction type second diffusion region.

According to another aspect of the present invention there is provided a method for producing a semiconductor device comprising: a formation step, by patterning, of an output region of a protruded form for a substrate electric potential with its end portion being tapered, a step for implanting ion impurities of a first conduction type into an overall surface, including a surface and tapered portion of the output region for the substrate electric potential, a step for subsequently forming selectively a field insulating layer with selective oxidation, and a step for forming a first conduction type diffusion region continuously from the surface of the output region for the substrate electric potential to the bottom of the field insulating layer.

DETAILED DESCRIPTION OF THE PREFERRED EMBODIMENT

Figure 1:
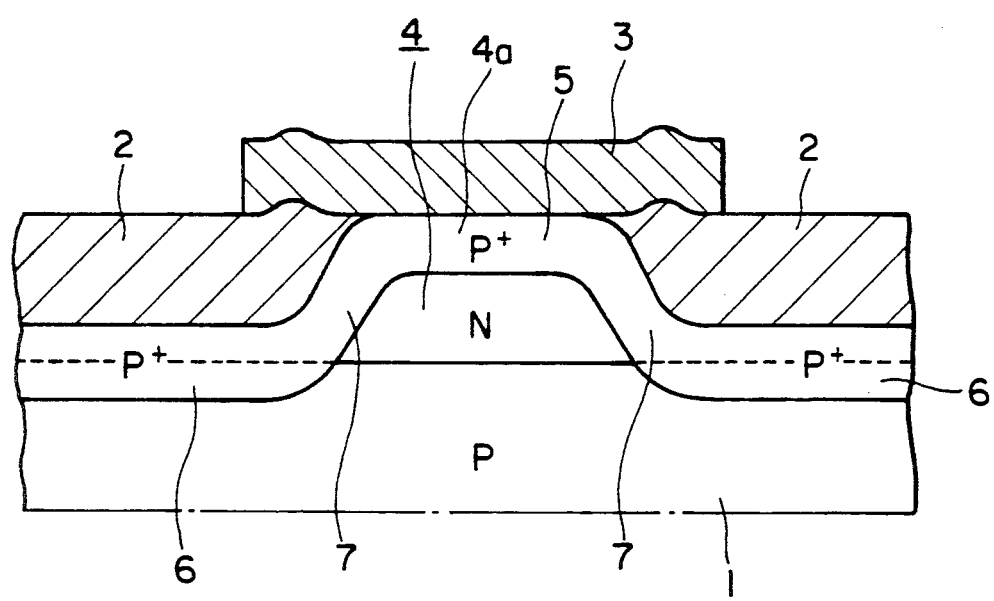
FIG. 1 is a cross-sectional view showing the semiconductor device of the present invention.

As shown in FIG. 1, a semiconductor device of the present invention is comprised as follows. A first conduction type element segregation third diffusion region 6 connects with first conduction type first and second diffusion regions 5 and 7 under a field insulating layer 2. A surface 4a of an output region 4 of a substrate electric potential is surrounded with the first conduction type diffusion region 5. The element segregation third diffusion region 6 is in electrical contact with the surface 4a of the output region 4 for the substrate electric potential at an end portion of the field insulating layer 2 through the first conduction type diffusion region 7.

Further, a process of fabricating the semiconductor device, in accordance with the present invention, comprises formation, by patterning, of the output region 4 of protruded form for the substrate electric potential with its end portion being tapered. Impurities of a first conduction type are ion implanted into an overall surface including the surface 4a and tapered portion 4b of the output region 4 for the substrate electric potential. A field insulating layer 2 is subsequently selectively formed with selective oxidation. First conduction type diffusion regions 5, 6 and 7 continuously from the surface 4a of the output region 4 for the substrate electric potential to the bottom of the field insulating layer 2.

The embodiments of the present invention will now be explained with reference to FIGS. 1 and 2.

FIG. 1 is a cross-sectional view showing the semiconductor device of the present invention, more particularly a structure of the output portion for the substrate electric potential. In the drawing figure, reference numeral 1 is a silicon substrate, 2 is a field insulating layer composed of $SiO_2$ or the like, and 3 is an electrode for outputting the substrate electric potential.

As shown in the figure, the first diffusion region 5 of a first conduction type, for example, P-type, is formed on a surface 4a of an output region 4 for the substrate electric potential, the output region being enclosed with a field insulating layer 2. Further, the P-type element segregation third diffusion region 6 is formed under the field insulating layer 2, and the first diffusion region 5 on the surface 4a of the output region for the substrate electric potential is formed to connect with the element segregation third diffusion region 6 through the P-type second diffusion region 7 formed in proximity to the field insulating layer 2.

A fabrication process of the semiconductor device of the present invention shown in FIG. 1, namely a structure of the output region for the substrate electric potential, is explained with reference to the schedule drawings shown in FIG. 2. The corresponding parts to those in FIG. 2 are represented by the same symbols.

Figure 2A:
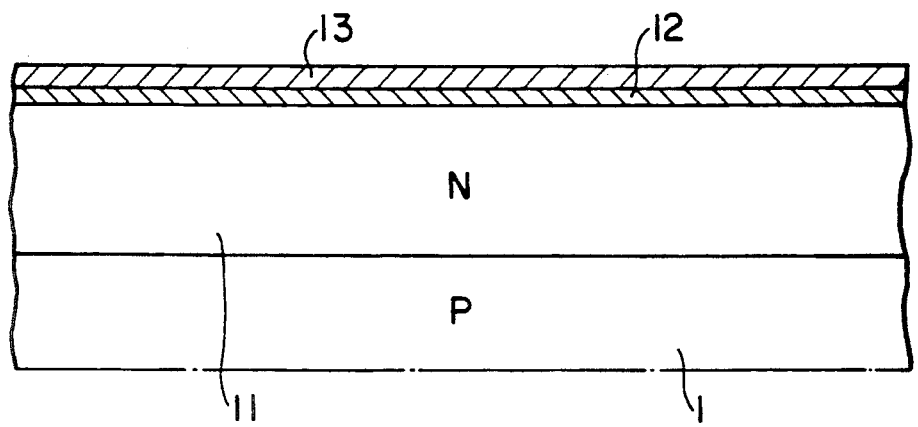
FIGS. 2A-2E are a sequence of drawings showing a fabrication process of a semiconductor device of the present invention.

As shown in FIG. 2A, at the beginning an epitaxial layer 11 of a second conduction type, for example N-type, is formed on a silicon substrate of a first conduction type, for example P-type, and secondly an $SiO_2$ film 12 of a film thickness of about 300 Å is layered on the whole surface of the epitaxial layer 11. Then a film 13 made of $Si_3N_4$, thickness 500 to 1500 Å (about 1000 Å in the present example) is accumulated on the whole surface of the $SiO_2$ film 12.

Figure 2B:
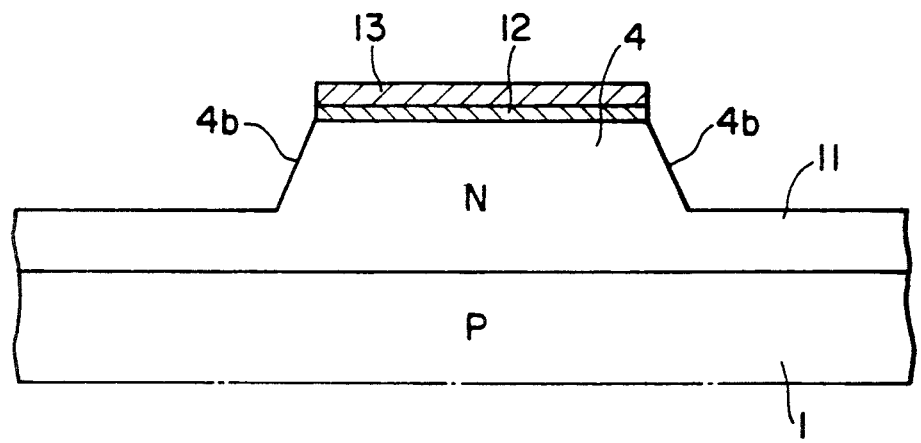

As shown in FIG. 2B, patterning of the epitaxial layer 11 is carried out so as to form the output region 4 for the substrate electric potential into a protruded shape. In other words, the epitaxial layer excluding the output region 4 for the substrate electric potential is partially etched off. For this etching a KOH solution, hydrazine or plasma are available. In order that the end portions 4b of the output region 4 for the substrate electric potential may make a tapered form, the patterning of the epitaxial layer 11 is carried out by use of a face orientation. The patterning of the epitaxial layer 11 is also carried out in other element forming regions in which transistors or the like are to be formed.

Figure 2C:
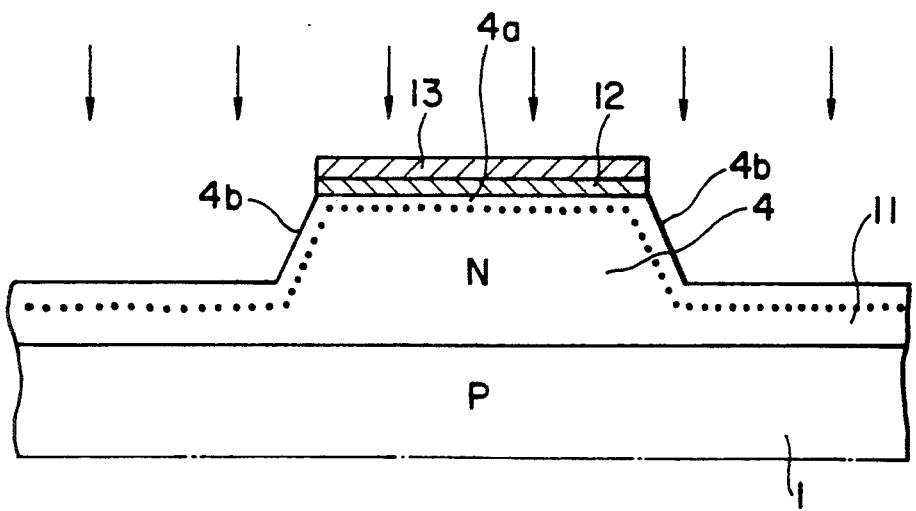

As shown in FIG. 2C, P-type impurities, for example boron ion $B^+$, are subsequently implanted into the whole surface including the surface 4a of the output region 4 for the substrate electric potential and the end portion thereof, namely the tapered portion 4b, at a high energy from 100 KeV to 300 KeV. In the present invention, ion implantation of an amount of $4 \times 10^{14}/cm^2$ was carried out at the energy of about 180 KeV. Boron ion $B^+$ is implanted to the surface 4a of the output region 4 for the substrate electric potential and the tapered silicon surface, namely the tapered portion 4b.

Figure 2D:
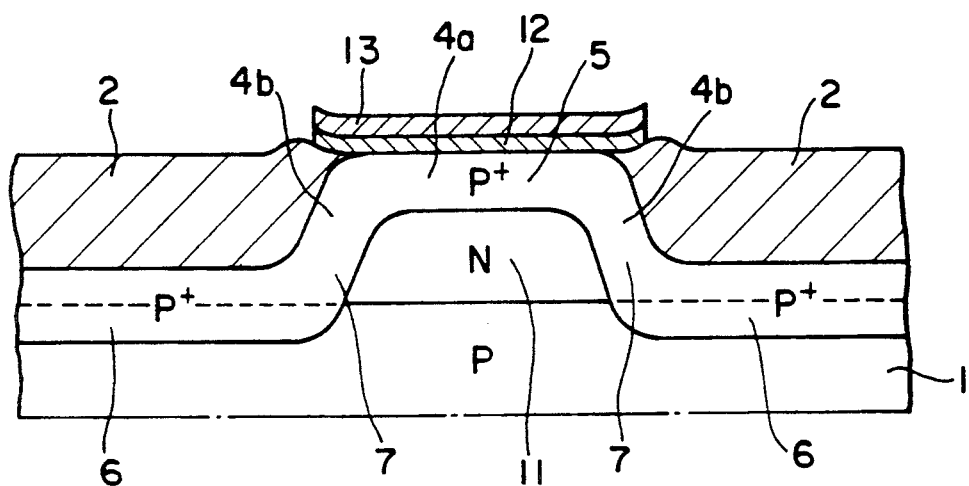

As shown in FIG. 2D, a LOCOS (selective oxidation) is then performed to form a field insulating layer 2 selectively, namely on the part excluding the output region 4 for the substrate electric potential. Because an $Si_3N_4$ film as an antioxidative film is then formed on the output region 4 for the substrate electric potential, the output region 4 for the substrate electric potential is not oxidized. Along with a P-type first diffusion region 5 to be formed on the surface 4a for the output region 4 for the substrate electric potential, a P-type diffusion region, that is an element segregation third diffusion region 6, is also formed under the field insulating layer 2. Furthermore, a P-type second diffusion region 7 is also formed on the silicon surface in proximity to the end portion of the field insulating layer 2, that is the tapered portion 4b.

Because boron ions $B^+$ are continuously implanted into the bottom of the field insulating layer 2, the tapered portion 4b and the surface 4a at the ion implantation process as shown in FIG. 2C, and the diffusion regions 5, 6 and 7 are continuously formed at the time of such selective oxidation to be joined with each other. In other words, the first diffusion region 5 on the surface 4a of the output region of the substrate electric potential and the third diffusion region 6 under the field insulating layer 2 are electrically connected together through the second diffusion region 7 at the tapered portion 4b.

Figure 2E:
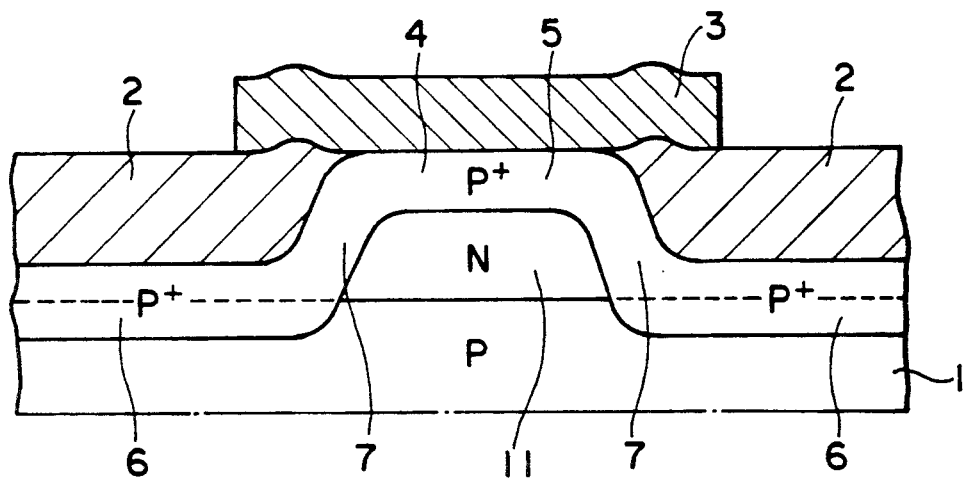
Figure 3:
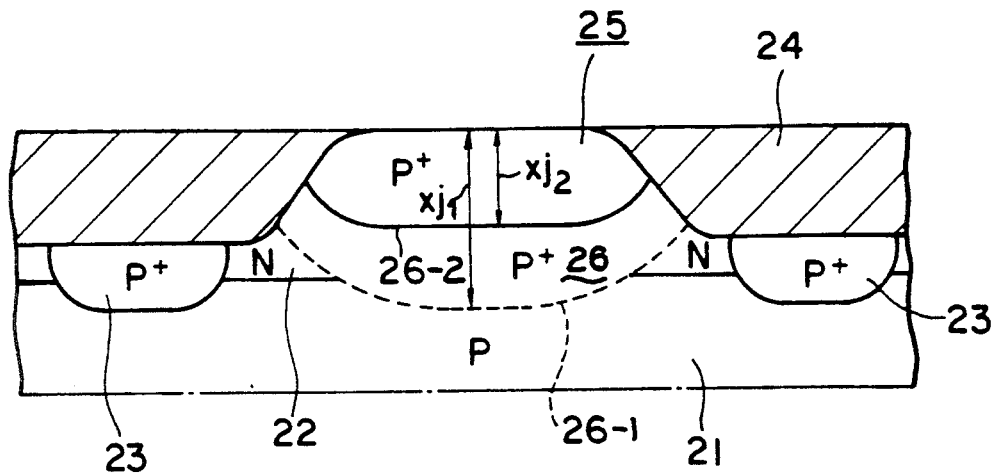
FIG. 3 is a cross-sectional view showing a conventional semiconductor device.
Figure 4:
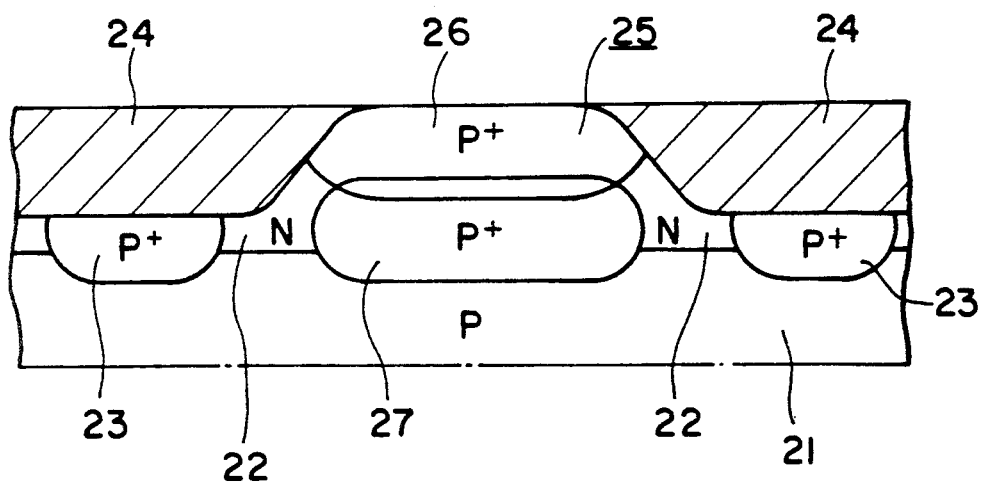
FIG. 4 is a cross sectional view showing another conventional device.

As shown in FIG. 2E, after peeling off the $SiO_2$ film 12 and the $Si_3N_4$ film 13 on the output region 4 for the substrate electric potential, an output electrode 3 for the substrate electric potential made of Al or the like is formed on the output region 4 for the substrate electric potential to obtain the semiconductor device of the present invention.

As described above, in accordance with the present invention, patterning of the epitaxial layer 11 is carried out to form the output region 4 of the substrate electric potential and the end portion 4b thereof into a protruded shape and a tapered form, and then the impurity ions are implanted into the tapered portion 4b, so that the first diffusion region 5 on the surface 4a of the output region for the substrate electric potential and the third diffusion region 6 under the field insulating layer 2 are electrically connected together, through the second diffusion region 7 at the tapered portion 4b, by the subsequent selective oxidation process. In other words, the selective oxidation is performed to such a degree that the element segregation third diffusion region 6 passes through the remaining epitaxial layer 11 after patterning of the portion excluding the output region 4 for the substrate electric potential, that is, the output portion for the substrate electric potential can be arranged in a low temperature thermal treatment.

Thus, the substrate electric potential can be easily output on the surface 4a of the output region for the substrate electric potential, even if the first diffusion region 5 on the surface 4a of the output region of the substrate electric potential is formed as in shallow fashion by the low temperature thermal treatment due to the fine designing of the semiconductor devices.

In view of the production process, the process of patterning the output region 4 for the substrate electric potential into a protruded form is required as well, but the process is completed through a procedure using only one ion implantation and one low temperature thermal treatment (selective oxidation), thereby dramatically simplifying the fabrication process.

In the above example, P-type and N-type are used as the first conduction type and the second conduction type, respectively, but N-type and P-type may be used as the first conduction type and the second conduction type, respectively, as well.

The semiconductor device of the present invention is constituted such that the element segregation region under the field insulating region and the diffusion region on the surface of the output region for the substrate electric potential are electrically connected together at the end portion of the field insulating layer. Thus, the substrate electric potential can be easily output at the surface of the output region for the substrate electric potential, even if the diffusion region on the surface of the output region for the substrate electric potential is formed as being shallow by the low temperature thermal treatment due to the fine designing of the semiconductor device.

The process of fabricating a semiconductor device, in accordance with the present invention, comprises forming, by patterning, of the output region for the substrate electric potential and the end portion thereof into a protruded portion and tapered form, respectively, ion implanting of the impurities into the overall surface including the surface and tapered portion of the output region for the substrate electric potential, subsequently forming selectively a field insulating layer with selective oxidation, and simultaneously forming impurity-diffusion regions continuously from the surface of the output region for the substrate electric potential to the bottom of the field insulating layer, whereby the substrate electric potential can be output from the surface of the output region for the substrate electric potential, in the semiconductor device where the depth of the impurity-diffusion region is formed as being shallow due to the fine designing of semiconductor devices, and there can thus be achieved simplification of the fabrication process thereof.

Although various minor changes and modifications might be proposed by those skilled in the art, it will be understood that we wish to include within the claims of the patent warranted hereon all such changes and modifications as reasonably come within our contribution to the art.

What is claimed is:

1. A substrate output for a semiconductor device, comprising:
    a semiconductor substrate of first conductivity type;
    an epitaxial layer of second conductivity type on a portion of the surface of the substrate and defined by tapered portions at sides thereof to serve as an output region for the substrate;
    an element segregation third diffusion region of first conductivity type surrounding the output region at a top surface of the substrate;
    a field insulating layer formed on said element segregation third diffusion region; and
    a first conductivity type first diffusion region at a top surface of said output region and a first conductivity type second diffusion region joining the first diffusion region to the third diffusion region at said tapered side portions of said output region.

2. A substrate output according to claim 1 wherein a substrate electrode is formed on said first diffusion region at said top surface of said output region.

3. A method for producing a substrate output in a semiconductor device, comprising:
    providing a semiconductor substrate of first conductivity type;
    forming an epitaxial layer of second conductivity type on the semiconductor substrate;
    patterning said epitaxial layer to serve as a substrate output region by providing tapered portions at sides of the epitaxial layer;
    ion implanting impurities of first conductivity type onto a top surface of said output region, along said tapered side portions of said output region, and at a surface of said substrate laterally adjacent to said tapered portions so as to form an element segregation region; and
    applying a field insulating layer on said element segregation region and extending to said tapered portions; and
    forming a first conductivity type diffusion region continuously from and on a top surface of said output region along said tapered side portions to a bottom of said field insulating layer so as to join a first conductivity region at said top of said output region to said element segregation region, and also applying a field insulating layer on said element segregation region and extending to said tapered side portions.

4. A method according to claim 3 including the step of applying a substrate output electrode on a top surface of said output region at said first conductivity type diffusion region.

5. A method according to claim 3 wherein when said epitaxial layer is shaped with tapered portions to form said output region, a portion of said epitaxial layer remains above the silicon substrate, and said portion is converted to said first conductivity type element segregation region lying between a portion of the substrate and subsequently applied field insulating layer.

* * * * *